(12) United States Patent
Malinin (10) Patent No.: US 10,003,248 B1
(45) Date of Patent: Jun. 19, 2018

(54) CONTROL ALGORITHM FOR POWER ELECTRONICS BASED ON TIME DURATIONS

(71) Applicant: Infineon Technologies Austria AG, Villach (AT)

(72) Inventor: Andrey Malinin, Fort Collins, CO (US)

(73) Assignee: Infineon Technologies Austria AG, Villach (AT)

( * ) Notice: Subject to any disclaimer, the term of this patent is extended or adjusted under 35 U.S.C. 154(b) by 0 days. days.

(21) Appl. No.: 15/636,228

(22) Filed: Jun. 28, 2017

(51) Int. Cl.
*H02M 1/08* (2006.01)
*H02M 3/335* (2006.01)
*H02M 1/36* (2007.01)
*G01R 23/02* (2006.01)

(52) U.S. Cl.
CPC ............ *H02M 1/083* (2013.01); *G01R 23/02* (2013.01); *H02M 1/36* (2013.01); *H02M 3/33576* (2013.01)

(58) Field of Classification Search
CPC ........... H02M 1/083; H02M 1/333507; H02M 1/33546; H02M 3/33592
USPC ............................... 363/21.06, 21.14, 95, 97
See application file for complete search history.

(56) References Cited

U.S. PATENT DOCUMENTS

| | | | | |
|---|---|---|---|---|
| 5,745,358 A | * | 4/1998 | Faulk | H02M 3/33523 363/21.13 |
| 6,031,747 A | * | 2/2000 | Ilic | H02M 3/285 363/21.12 |
| 6,788,555 B2 | * | 9/2004 | Boudillon | H02M 3/33584 363/21.14 |
| 7,304,867 B2 | * | 12/2007 | Usui | H02M 3/33561 336/183 |
| 7,450,402 B2 | | 11/2008 | Jitaru | |
| 9,184,668 B2 | * | 11/2015 | Telefus | H02M 3/33523 |
| 9,602,015 B2 | | 3/2017 | Mednik et al. | |
| 2004/0218406 A1 | * | 11/2004 | Jang | H02J 5/005 363/37 |
| 2010/0110732 A1 | | 5/2010 | Moyer et al. | |

(Continued)

FOREIGN PATENT DOCUMENTS

WO 2016085542 A1 6/2016

OTHER PUBLICATIONS

Connaughton, et al., "New Control Concept for Soft-Switching Flyback Converters with Very High Switching Frequency," IEEE, 2016, pp. 355-361.

(Continued)

*Primary Examiner* — Jeffrey Sterrett
(74) *Attorney, Agent, or Firm* — Shumaker & Sieffert, P.A.

(57) ABSTRACT

In some examples, a method includes measuring, by a secondary controller, an output voltage and determining, by the secondary controller, a duration for a ringing time based on the output voltage. In some examples, the method further includes delivering, by the secondary controller, a non-enabling control signal to a secondary switch during the ringing time and measuring, by a primary controller, a duration of the ringing time. In some examples, the method also includes determining, by the primary controller, a duration for a charging time based on the duration of the ringing time and delivering, by the primary controller, an enabling control signal to a primary switch during the charging time.

20 Claims, 6 Drawing Sheets

(56) References Cited

U.S. PATENT DOCUMENTS

| | | | |
|---|---|---|---|
| 2012/0013369 A1* | 1/2012 | Coteus | H02M 3/33592 327/109 |
| 2014/0098578 A1* | 4/2014 | Halberstadt | H02M 3/33515 363/21.15 |
| 2015/0280573 A1* | 10/2015 | Gong | H02M 3/33523 363/21.14 |
| 2017/0033698 A1* | 2/2017 | Vemuri | H02M 3/33523 |

OTHER PUBLICATIONS

Yoshida, et al., "Zero Voltage Switching Approach for Flyback Converter," IEEE 1992, pp. 324-329.

\* cited by examiner

CONTROL ALGORITHM FOR POWER ELECTRONICS BASED ON TIME DURATIONS

TECHNICAL FIELD

This disclosure relates to controllers for power electronics.

BACKGROUND

An off-line power supply circuitry may receive electrical power from an alternating-current (AC) main supply (e.g., an electrical grid) and convert it to a lower direct-current (DC) voltage suitable to power an electrical load. An off-line power supply may include safety isolation between the input side (e.g., primary-side circuitry) and the output side (e.g., secondary-side circuitry). The regulating element of the power supply (e.g., the primary controller) may be on the primary side, but the regulated parameter (e.g., the output DC voltage) may be available only on the secondary side.

Therefore, the power supply circuitry may include some kind of communication media to send information from the secondary side to primary side. The power supply circuitry may include an optocoupler for this purpose, but some other devices like capacitive- or transformer-based couplers are gaining popularity. For many types of device for sending information, the signal may pass through the safety isolation, which may increase the system cost, may consume take space, and may reduce system reliability.

SUMMARY

This disclosure describes techniques for determining durations for time intervals of a switching period of a power electronics system. The switching cycle may include a ringing time and a charging time. A secondary-side controller of the power electronics system may be configured to determine a duration for the ringing time based on an output voltage of the power electronics system. A primary-side controller of the power electronics system may be configured to determine a duration for the charging time based on the duration of the ringing time.

In some examples, a method includes measuring, by a secondary controller, an output voltage and determining, by the secondary controller, a duration for a ringing time based on the output voltage. The method further includes delivering, by the secondary controller, a non-enabling control signal to a secondary switch during the ringing time and measuring, by a primary controller, a duration of the ringing time. The method also includes determining, by the primary controller, a duration for a charging time based on the duration of the ringing time and delivering, by the primary controller, an enabling control signal to a primary switch during the charging time.

In some examples, a system includes primary-side circuitry including a primary switch, a primary winding of a transformer, and a primary controller. The system further includes secondary-side circuitry including a secondary switch, a secondary winding of the transformer magnetically coupled to the primary side, and a secondary controller configured to measure an output voltage of the secondary-side circuitry, wherein the output voltage is based on a signal flowing through the primary winding of the transformer during a charging time. The secondary controller is further configured to determine a duration for a ringing time based on the output voltage and deliver a non-enabling control signal to the secondary switch during the ringing time. The primary controller is configured to measure a duration of the ringing time and determine a duration for the charging time based on the duration of the ringing time. The primary controller is also configured to deliver an enabling control signal to the primary switch during the charging time to cause the signal to flow through the primary winding of the transformer during the charging time.

In some examples, a primary-side controller is configured to measure a duration of a ringing time by at least detecting a signal flowing through a secondary winding of a transformer that is magnetically coupled to a primary winding of the transformer. The primary-side controller is further configured to determine a duration for a charging time based on the duration of the ringing time and deliver an enabling control signal to a primary switch of the primary-side circuit during the charging time.

The details of one or more examples are set forth in the accompanying drawings and the description below. Other features, objects, and advantages will be apparent from the description and drawings, and from the claims.

DETAILED DESCRIPTION

It may be desirable to eliminate a communication device for power electronics systems while still maintaining off-line power supply performance. For example, a communication device such as an optocoupler may consume space in a power electronics system. Moreover, the communication device may increase the total expense of the power electronics system. It may be specifically important for low-power power supplies (e.g., travel adapters), where the cost and space occupied by a communication device are very critical.

This disclosure describes techniques for controlling the operations of a power electronics system by detecting signals flowing through a transformer of the power electronics system. For example, a controller on the primary side of the power electronics system may be configured to measure the duration of a ringing time by at least detecting a signal (e.g., an electrical current and/or a voltage signal) flowing through the secondary winding of the transformer. The signal flowing through the secondary winding may be based on the operation of a secondary switch connected in series with the secondary winding. As another example, a controller on the secondary side of the power electronics system may be configured to measure the output voltage of the power electronics system, which may be based on a signal flowing through the primary winding of the transformer during a charging time. The signal flowing through the primary winding may be based on the operation of a primary switch connected in series with the primary winding. In this way, the controllers may detect the operations on the other side of the power electronics system without a separate communication device.

There may be two approaches to communicating information from the secondary side to the primary side. The first approach may be to extract the information about the output voltage from the waveform on the primary or auxiliary transformer winding (e.g., primary side regulation (PSR)), and second approach may be to use the power transformer to communicate the needed information from the secondary side to the primary side. In both cases, an optocoupler may not be necessary for the power electronics system.

For PSR, the information about the output voltage may be available during a switching cycle. In low-power modes of operation when switching frequency is low, the delay from a load change to a delivered power change may be relatively long. This delay may cause poor transient performance, and the waveform used for the measurement may be distorted, so the precision is not very good. Another approach may include communicating across a galvanic boundary the information using a Synchronous Rectifier (SR). A power electronics system may use this approach in combination with the Zero Voltage Switching (ZVS).

One drawback of these control methods may be the constant peak current (or primary switch on-time). The pulse may be relatively large to provide enough power at full load. Therefore, the voltage ripple may change relatively little based on the impedance of the electrical load, which may not be desirable. The voltage ripple at light loads may be lower than the voltage ripple at heavy loads.

One possibility of a strong pulse is audible noise at lower power when the transformer core is shacked by the strong current is very loud. One approach to avoid this issue is to reduce the electrical current (e.g. on-time of a primary switch) significantly before reducing the frequency down to an audible region. This option may not always be feasible with other approaches mentioned above.

In some examples, it may be desirable to maintain a stable switching frequency and avoid a variable switching frequency. Variable switching frequencies can cause significant common noise issues depending on the electrical load receiving power from the power electronics system. In some examples, if the electrical load includes a capacitive touch screen, the touch screen controllers may be configured to tolerate fixed frequency noise by tuning their operating frequency to a quiet zone away from the fixed frequency noise. If, however, the switching frequency of the power electronics system is variable, then the electrical load may be able to tolerate the common-mode noise.

A solution may include a control algorithm in the primary controller to modulate the on-time of the primary switch (e.g., the charging time). Thus, the primary controller may be configured to increase the duration of the charging time to deliver more electrical power to the output nodes of the power electronics system or decrease the duration of the charging time to deliver less electrical power to the output nodes. The primary controller may be configured to monitor the ringing time and the ZVS pulse delivered by the secondary controller to the secondary switch. In some examples, a power electronics system of this disclosure may include fewer components, as compared to other power electronics systems.

Figure 1:
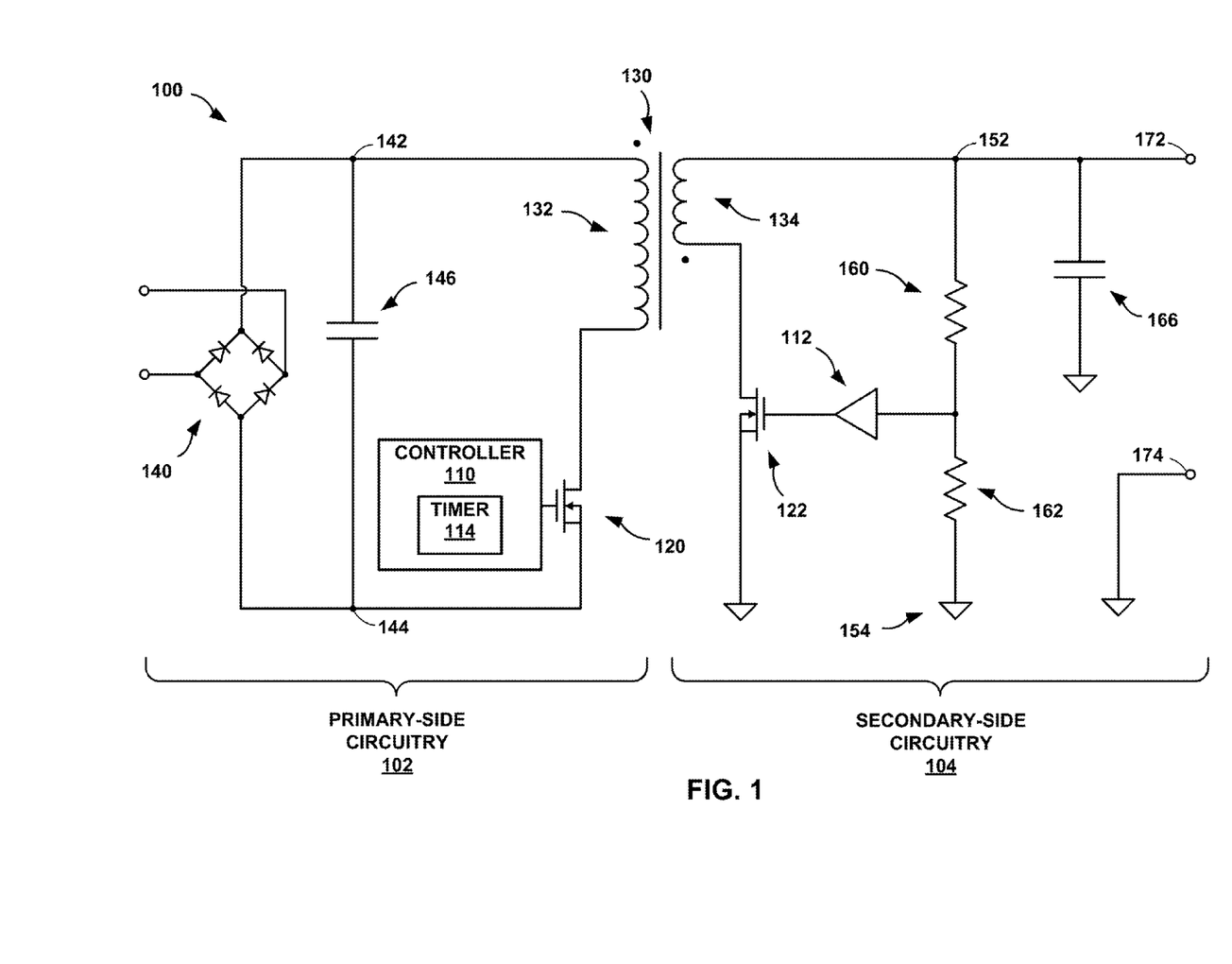
FIG. 1 is a circuit diagram of a power electronics system including primary-side circuitry and secondary-side circuitry, in accordance with some examples of this disclosure.

FIG. 1 is a circuit diagram of a power electronics system 100 including primary-side circuitry 102 and secondary-side circuitry 104, in accordance with some examples of this disclosure. Power electronics system 100 may include a power conversion device, an analog electrical device, an embedded system, an integrated circuit (IC) device, a motor driver circuit, and/or any other electrical device. In some examples, power electronics system 100 may include an alternating-current-to-direct-current (AC/DC) conversion device, a DC/DC conversion device, and/or any other conversion device. In some examples, power electronics system 100 may include a flyback conversion circuit, a buck conversion circuit, a boost conversion circuit, a buck-boost conversion circuit, a resonant-mode conversion circuit, a half-bridge circuit, an H-bridge circuit, and/or other conversion circuit.

Primary-side circuitry 102 may include primary controller 110 (i.e., primary-side controller 110), primary switch 120 (i.e., primary-side switch 120), primary winding 132 of transformer 130 (i.e., primary-side winding 132), rectification circuit 140, voltage rails 142 and 144, and capacitor 146. Primary-side circuitry 102 may be configured to receive electrical power through rectification circuit 140. Rectification circuit 140 may be configured to convert AC electricity from, for example, an electrical grid to DC electricity. Rectification circuit 140 may be configured to deliver the DC electricity to high-side voltage rail 142 and low-side voltage rail 144. Capacitor 146 may be configured to smooth the voltage difference between voltage rails 142 and 144 by at least transmitting higher-frequency signals and blocking lower-frequency signals between voltage rails 142 and 144. Voltage rails 142 and 144 may be configured to deliver DC electricity to primary switch 120 and primary winding 132.

Secondary-side circuitry 104 may include secondary controller 112 (i.e., secondary-side controller 112), secondary switch 122 (i.e., secondary-side switch 122), secondary winding 134 of transformer 130 (i.e., secondary-side winding 134), voltage rails 152 and 154, divider elements 160 and 162, and capacitor 166. Secondary-side circuitry 104 may be configured to receive electrical power through secondary winding 134. Secondary winding 134 may be configured to deliver electricity to high-side voltage rail 152. Capacitor 166 may be configured to smooth the voltage difference between voltage rails 152 and 154 by at least transmitting higher-frequency signals and blocking lower-frequency signals between voltage rails 152 and 154. The output voltage of power electronics system 100 and the output voltage of secondary-side circuitry 104 may be measured across output node 172 and 174, which may be electrically connected to voltage rails 152 and 154, respectively.

Primary controller 110 may be configured to control the operations of primary switch 120 by delivering control signals to a control terminal of primary switch 120. Secondary controller 120 may be configured to control the operations of secondary switch 122 by delivering control signals to a control terminal of secondary switch 122. Switches 120 and 122 may be power switches such as, but not limited to, any type of field-effect transistor (FET), a bipolar junction transistor (BJT), an insulated-gate bipolar transistor (IGBT), a high-electron-mobility transistor (HEMT), a gallium-nitride (GaN) based transistor, or another element that uses voltage for its control. Switches 120 and 122 may include n-type transistors or p-type transistors and may be power transistors. In some examples, switches 120 and 122 may be vertical transistors, lateral transistors, and/or horizontal transistors. In some examples, switches 120 and 122 may include other analog devices such as diodes and/or thyristors. Switches 120 and 122 may also include a freewheeling diode connected in parallel with a transistor to prevent reverse breakdown of the transistor. In some examples, the switches 120 and 122 may operate as switches and/or as analog devices.

Each of switches 120 and 122 may include three terminals: two load terminals and a control terminal. For MOSFET switches, switches 120 and 122 may include a drain terminal, a source terminal, and at least one gate terminal, where the control terminals are gate terminals. For BJT switches, control terminals may be base terminals. Current may flow between the load terminals of switches 120 and 122, based on the voltage at control terminals.

Switches 120 and 122 may include various material compounds, such as silicon (Si), silicon carbide (SiC), Gallium Nitride (GaN), or any other combination of one or more semiconductor materials. To take advantage of higher power density requirements in some circuits, power converters may operate at higher frequencies. In some examples, silicon carbide switches may experience lower switching power losses. Improvements in magnetics and faster switching, such as Gallium Nitride switches, may support higher frequency converters. These higher frequency circuits may require control signals to be sent with more precise timing, as compared to lower-frequency circuits. In some examples, power electronics system 100 may be configured to operate at switching frequencies of one hundred kilohertz, two hundred kilohertz, fifty kilohertz, and/or any other suitable frequency. In some examples, the time durations described may be fractions of a switching period, such that a ringing time may be on the order of one or two microseconds, and a charging time may be on the order of two hundred or five hundred nanoseconds.

Controllers 110 and 112 may be configured to configured to deliver control signals to the control terminals of switches 120 and 122 to control the flow of electricity between the load terminals of switches 120 and 122. The control signals delivered by controllers 110 and 112 may be square waveforms with an enabling period and a non-enabling period. The enabling period of a control signal, for example, may be the period of time during which the control signal enables a respective switch to conduct electricity between the load terminals of the respective switch. A controller may be configured to deliver and sustain an enabling control signal or a non-enabling control signal for a time interval such as a ringing time or a charging time. In some examples, a control signal may be referred to as one or more control signals that last for a certain amount of time. There may be time intervals during which controllers 110 and 112 cause zero, one, or both of switches 120 and 122 to conduct electricity.

In accordance with the techniques of this disclosure, controllers 110 and 112 may be configured to indirectly detect signals flowing through transformer 130, including an opposite winding of transformer 130. For example, primary controller 110 may be configured to measure a duration of a ringing period caused by the signal flowing through secondary winding 134, even though primary controller 110 may be galvanically isolated from secondary winding 134. Primary controller 110 may be configured to measure the duration of the ringing time through several methods, as described herein.

In some examples, secondary controller 112 may be configured to determine and control the duration the ringing time by controlling the on- and off-times of secondary switch 122. For example, secondary controller 112 may be configured to start a beginning of a ringing time by delivering non-enabling control signals to the control terminal of secondary switch 122. The ringing time may occur after a discharging time and before a ZVS time. During the discharging time and the ZVS time, secondary controller 112 may deliver enabling control signals to the control terminal of secondary switch 122. By delivering enabling and non-enabling control signals to secondary switch 122, secondary controller 112 may be configured to control the signal flowing through secondary winding 134. An enabling control signal may cause a switch to conduct electrical current, whereas a non-enabling control signal may cause a switch to not conduct electrical current.

Primary controller 110 may be configured to detect the signal flowing through secondary winding 134 by at least monitoring the voltage drop across primary switch 120, the electrical current flowing through primary switch 120, and/or the electrical current flowing through primary winding 132. The voltage drop across primary switch 120, the electrical current flowing through primary switch 120, and/or the electrical current flowing through primary winding 132 may be at least partially based on the signal flowing through secondary winding 134. Thus, in some examples, primary controller 110 may be configured to determine a duration of a charging time without a separate communication device, such as an optocoupler or a separate transformer. Instead, primary controller 110 may include current sensing circuitry and/or voltage sensing circuitry for measuring the duration of the ringing time.

Secondary controller 112 may be configured to determine a time duration for a ringing time and/or other time intervals without a separate communication device. For example, secondary controller 112 may be configured to measure the voltage across output nodes 172 and 174 by at least monitoring the voltage between divider elements 160 and 162. Each of divider elements 160 and 162 may include resistive and/or capacitive elements configured to divide the voltage level of high-side voltage rail 152 and deliver the divided voltage to secondary controller 112. The voltage across output nodes 172 and 174 may be based at least in part on the signal flowing through primary winding 132. Secondary controller 112 may also include current sensing circuitry and/or voltage sensing circuitry for monitoring the electrical currents through secondary switch 122 and/or secondary winding 134 and/or the voltage drop across secondary switch 122.

Figure 2:
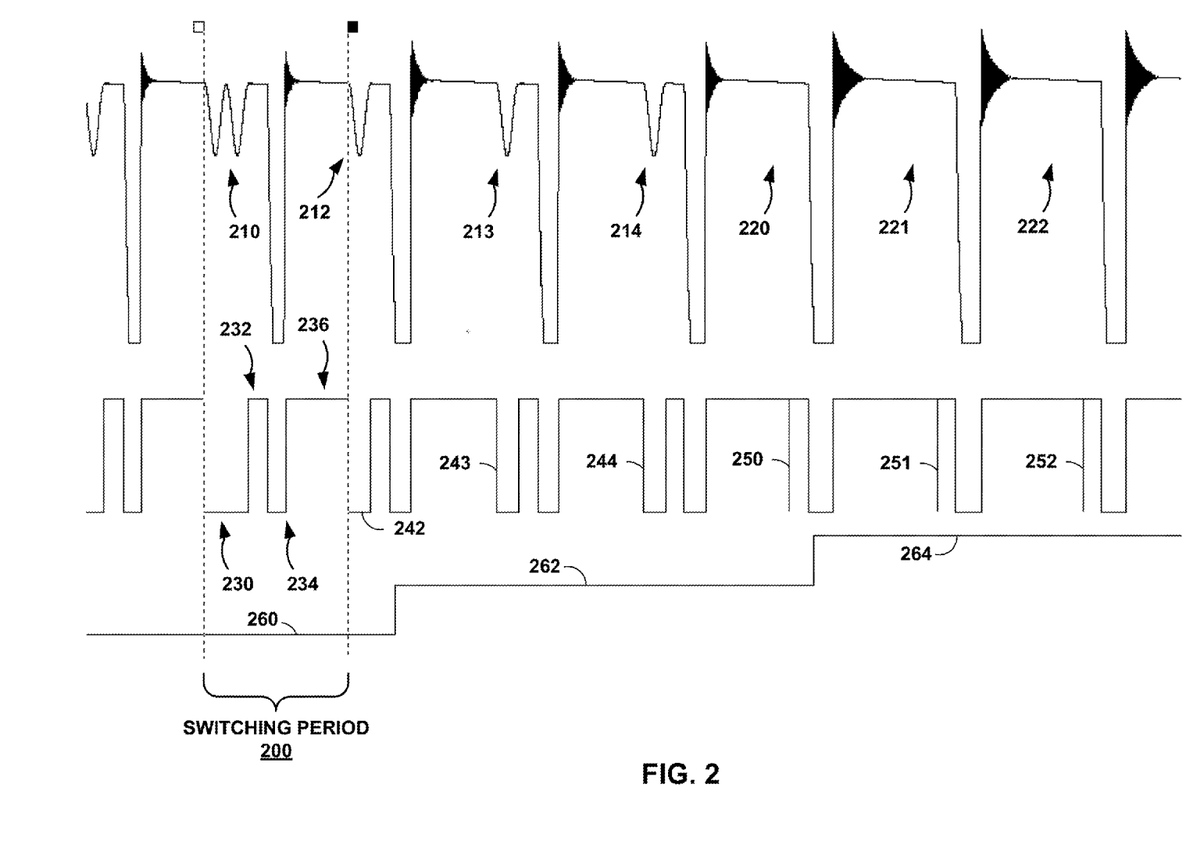
FIG. 2 depicts timing diagrams of example operations of a power electronics system during several switching periods, in accordance with some examples of this disclosure.

FIG. 2 depicts timing diagrams of example operations of a power electronics system during several switching periods, in accordance with some examples of this disclosure. The timing diagrams of FIG. 2 may illustrate the continuous operation of a power electronics system by not including the initial startup sequence of the power electronics system. FIG. 2 includes cursors indicating switching period 200. The timing diagrams of FIG. 2 may also illustrate part of a previous switching period before switching period 200 and several switching periods after switching period 200.

FIG. 2 depicts three timing diagrams. The top (i.e., first) timing diagram illustrates the voltage drop across a primary switch (e.g., primary switch 120) over time. The first timing diagram shows four time intervals in switching period 200.

The first time interval in switching period 200 may be a ringing time when the voltage drop oscillates due to the resonance of a transformer (e.g., transformer 130). The ringing time may be the first time interval in the switching period and may be a time interval in which the secondary controller may deliver a non-enabling control signal to the secondary switch. The second time interval in switching period 200 may be a ZVS time when the voltage drop remains relatively stable at approximately the voltage difference between two voltage rails (e.g., voltage rails 142 and 144). The third time interval in switching period 200 may be a charging time when the voltage drop declines to approximately zero. In some examples, the voltage drop may begin declining before the end of the ZVS time, and the primary controller may be configured to initiate the charging time by delivering enabling control signals to the primary switch in response to determining that the voltage drop is less than a threshold voltage level. The fourth time interval in switching period 200 may be a discharging time when the voltage drop remains relatively stable at approximately the voltage difference between the two voltage rails.

A primary controller (e.g., primary controller 110) may be configured to monitor the voltage drop across the primary switch by, for example, comparing the voltage level at the high side load terminal (e.g., the node between primary winding 132 and primary switch 120) to a threshold voltage level. The primary controller may include a comparator configured to compare the voltage drop across the primary switch to the threshold level and start and stop a timer 114 based on the comparison in order to measure the duration of the ringing time.

The middle (i.e., second) timing diagram illustrates the control signals delivered by a secondary controller (e.g., primary controller 112) to a secondary switch (e.g., primary switch 122). High values in the second timing diagram indicate enabling control signals, and low values in the second timing diagram indicate non-enabling control signals. The secondary controller is configured to deliver non-enabling control signals during the ringing time, enabling control signals during the ZVS time, non-enabling control signals during the charging time, and enabling control signals during the discharging time. Switching period 200 may include ringing time 230, ZVS time 232, charging time 234, and discharging time 236.

The secondary controller may be configured to determine the duration of each ringing time based on an output voltage (e.g., the voltage difference between output nodes 172 and 174). In some examples, the secondary controller may be configured to determine the duration of each ZVS time based on a predetermined or preset duration such that the ZVS time is the same across switching periods. In some examples, the secondary controller may be configured to monitor the duration of each charging time because the primary controller may be configured to determine the duration of the charging times. In some examples, the secondary controller may be configured to determine the duration of each discharging time based on the durations of the other three time intervals in order to make the sum of the durations of the four time intervals (e.g., the duration of a switching period) equal to a predetermined switching period duration. In some examples, each switching period may be equal to the predetermined switching period duration.

The bottom (i.e., third) timing diagram illustrates the peak current setting for the primary switch. FIG. 2 depicts the peak current setting at three possible values: low, medium, and high. During switching period 200, the peak current setting may have low value 260, such that the secondary controller may be configured to determine a relatively long ringing time 210 and 230 with two valleys in the voltage drop depicted in the first timing diagram. After switching period 200, the peak current setting may increase to medium value 262, such that the secondary controller may be configured to determine a relatively moderate duration for ringing times 212-214 and 242-244 of each switching period to cause one valley in the voltage drop of the first timing diagram. After several more switching periods, the peak current setting may increase to high value 264, such that the secondary controller may be configured to determine a duration of zero for the ringing times 220-222 and 250-252 of each switching period to cause no ringing in the voltage drop of the first timing diagram.

In some examples, the controller may be configured to implement duty-cycle control algorithms by determining the duration of the charging time based on a desired peak current. In some examples, the controllers of this disclosure may be configured to implement peak-current control algorithms by determining the duration of the charging time based on a desired peak current. For example, the primary controller may be configured to turn off the primary switch when the electrical current through the primary current exceeds a threshold magnitude. The peak current during the charging time may affect the magnitude of power transfer from the primary side to the secondary side.

By determining a shorter or zero duration for the ringing time, the secondary controller may allow the primary controller to determine a longer charging time such that the peak electrical current that flows through the primary switch may be higher than when the duration of the charging time is shorter. For example, as shown in FIG. 2, ringing time 210 and 230 during switching period 200 may include two ringing periods (e.g., two valleys in the voltage drop). Each of ringing times 212-214 and 242-244 during the next three switching periods may include one ringing period (e.g., one valley in the voltage drop). Each of ringing times 220-222 and 250-252 during the following three switching periods may include no ringing periods (e.g., no valleys in the voltage drop). The duration of the charging time may be inversely proportional to the duration of the ringing time. From FIG. 2, it can be seen that the switching frequency of the control signal of the primary switch may be a constant frequency, such that the time interval between rising edges of the control signals for the primary switch may stay mainly constant over time.

Figure 3A:
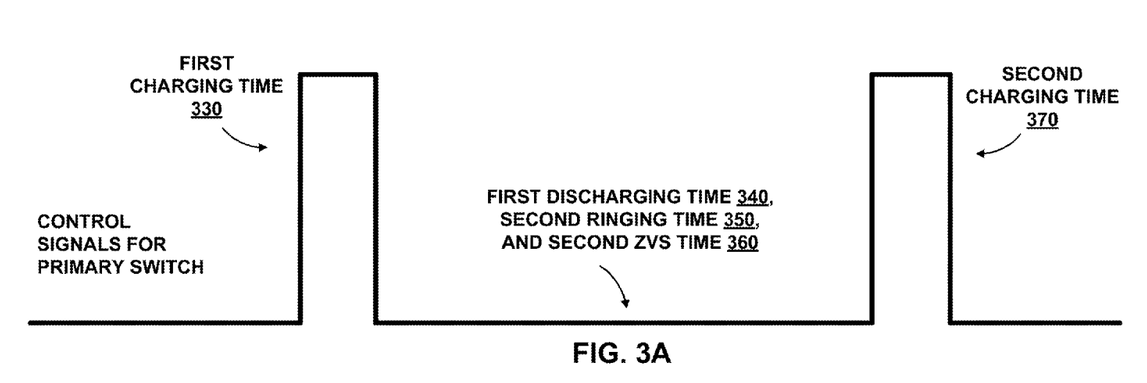
FIG. 3A depicts a timing diagram of example control signals delivered by a primary controller to a primary switch, in accordance with some examples of this disclosure.
Figure 3B:
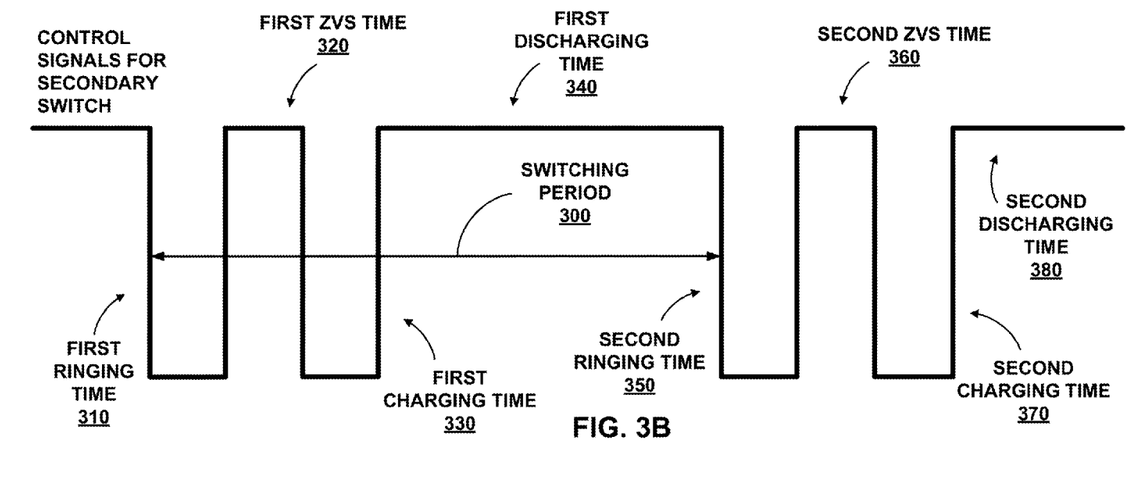
FIG. 3B depicts a timing diagram of example control signals delivered by a secondary controller to a secondary switch, in accordance with some examples of this disclosure.

FIG. 3A depicts a timing diagram of example control signals delivered by a primary controller to a primary switch, in accordance with some examples of this disclosure. FIG. 3B depicts a timing diagram of example control signals delivered by a secondary controller to a secondary switch, in accordance with some examples of this disclosure. In some examples, the primary and secondary controllers and the primary and secondary switches may be controller 110 and 112 and switches 120 and 122 of FIG. 1. Switching period 300 may include ringing time 310, ZVS time 320, charging time 330, and discharging time 340.

The primary controller may be configured to deliver enabling control signals during charging times 330 and 370 and deliver non-enabling control signals during ringing times 310 and 350, ZVS times 320 and 360, and discharging times 340 and 380. The secondary controller may be configured to deliver enabling control signals during ZVS times 320 and 360 and discharging times 340 and 380 and non-enabling control signals during ringing times 310 and 350 and charging times 330 and 370. In some examples, each switching period may have a preset duration, such that the switching frequency of the power electronics system is constant. By varying the durations of the ringing time and the charging time in each switching period, the controllers described herein may be configured to maintain a relatively constant switching frequency.

During ZVS times 320 and 360, the secondary controller may cause the secondary switch to conduct electricity, which may cause the voltage drop across the primary switch to decline. The primary controller may be configured to initiate charging times 330 and 370 when the voltage drop across the primary switch declines below a threshold level, so that the primary switch dissipates a lower amount of power, as compared to turning on the primary switch without a reduced voltage drop due to ZVS times 320 and 360. During charging times 330 and 370, the primary switch and the primary winding (e.g., primary winding 132) may conduct electricity. The electrical current through the primary switch and the primary winding may increase during charging times 330 and 370 to a peak current at the end of charging times 330 and 370. The energy stored in the transformer (e.g., transformer 130) may be proportional to the electrical current through the primary winding. In some examples, the primary controller may be configured to modulate charging times 330 and 370 of the primary switch by applying controlled dithering.

During discharging times 340 and 380, the secondary winding may discharge the energy stored in the transformer to an electrical load through the output nodes. In some examples, the electrical load connected to the output nodes may include an electronic device, a lighting device, a display device, an electrical motor, and/or any other electrical load. It may be desirable to maintain a constant switching frequency, especially if the electrical load includes a capacitive touch screen, because a filter may more easily filter out any noise from the switching frequency of the power electronics system. In contrast, if the switching frequency varies over time, it may be more difficult for a filter to remove any noise from the switching frequency of the power electronics system. An electrical load such as a capacitive touch screen may function better if any noise from a power electronics system is removed from the power delivered by the power electronics system.

Figure 4:
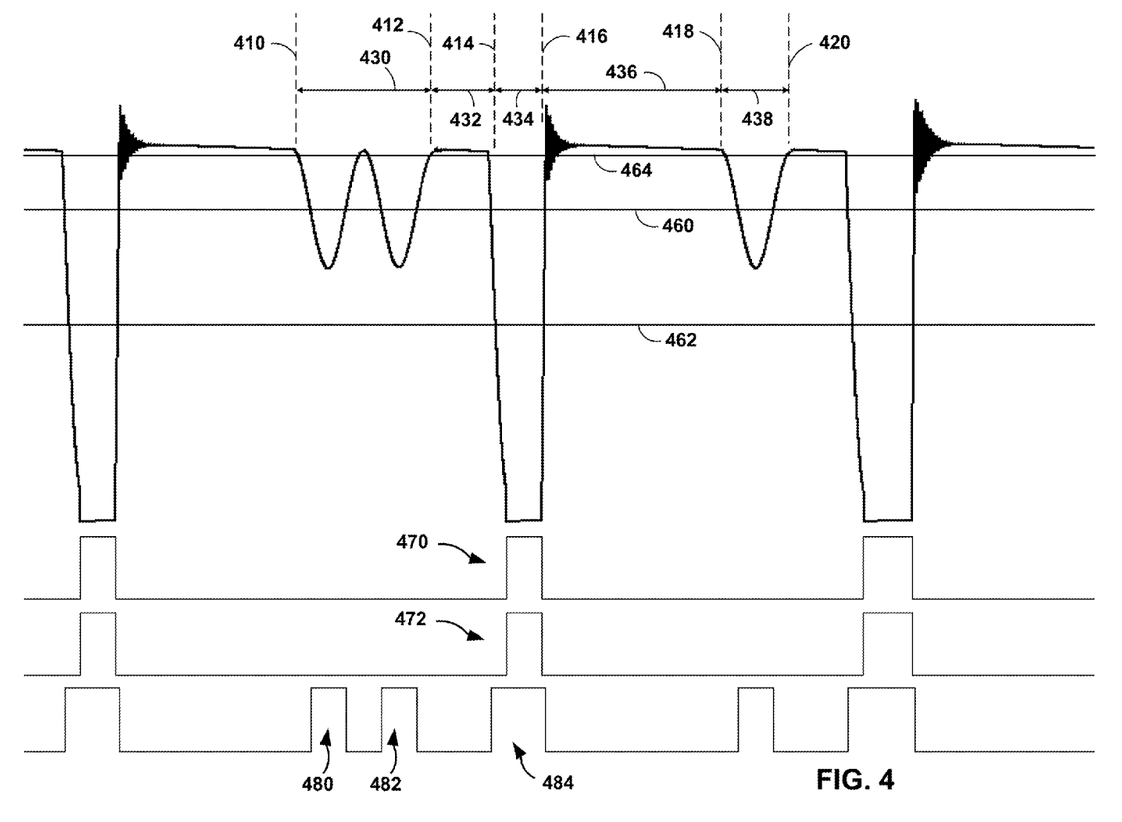
FIG. 4 is timing diagrams of example operations of a power electronics system during several switching periods, in accordance with some examples of this disclosure.

FIG. 4 is timing diagrams of example operations of a power electronics system during several switching periods, in accordance with some examples of this disclosure. FIG. 4 illustrates a first timing diagram of the voltage drop across a primary switch and a second timing diagram of an output signal from a comparator configured to determine that the voltage drop across the primary switch is less than a threshold voltage level. FIG. 4 also illustrates a third timing diagram of the control signals delivered by the primary controller to the primary switch and a fourth timing diagram of an output signal from a comparator configured to determine the direction of the electrical current through a primary winding of a transformer.

A first switching period (e.g., a control cycle) may start at time 410, and the first switching period may extend until time 418. At time 410, a previous switching cycle may finish, and the electrical current through a secondary winding of a transformer may have reduced down to zero amperes. In some examples, the secondary controller may be configured to measure the output voltage before time 410 by, for example, monitoring the voltage level at a voltage divider circuit. The secondary controller may be configured to calculate the power to supply to the output nodes of the power electronics system based on a control law or a control algorithm stored in a memory device of the secondary controller.

Based on the calculated power to supply to the output nodes, the secondary controller may be configured to calculate the duration for ringing time 430. The secondary controller may be configured to start a timer at time 410, and the timer may expire at time 412. The secondary controller may be configured to determine a duration of ringing time 430 based on the measured output voltage level by at least determining whether the current output voltage is greater than or less than a desired output voltage level. If the output voltage is less than the desired level, the secondary controller may be configured to determine a shorter duration for ringing time 430. If the output voltage is greater than the desired level, the secondary controller may be configured to determine a longer duration for ringing time 430.

The fourth timing diagram shows pulses 480 and 482 during ringing time 430 of a comparator configured to determine the direction of the electrical current through a primary winding of a transformer. The direction of the electrical current in the primary winding may directly affect the voltage drop across the primary switch during ringing time 430 because the primary switch may be turned off during ringing time 430. The comparator generating pulses 480, 482, and 484 may be located in the primary controller, and the primary controller may be configured to measure the duration of ringing time 430 by one or more of several methods. In some examples, the primary controller may be configured to start a timer at the beginning of pulse 480 (e.g., a rising edge of pulse 480), stop the timer at the end of pulse 480 (e.g., a falling edge of pulse 480), start the timer at the beginning of pulse 482 (e.g., a rising edge of pulse 482), and stop the timer at the end of pulse 482 (e.g., a falling edge of pulse 482). The duration of ringing time 430 may be approximately equal to twice the duration of pulses 480 and 482 if threshold voltage level 460 is approximately halfway between the valleys and the peaks of the voltage drop during ringing time 430. In some examples, the primary controller may be configured to count the number of pulses 480 and 482 during ringing time 430.

In some examples, the primary controller may be configured to measure the duration of ringing time 430 by measuring the combined duration of ringing time 430 and ZVS time 432 and subtracting the duration of ZVS time 432. To perform this measurement, the primary controller may be configured to start a timer at the beginning of pulse 480 (e.g., when the voltage drop is less than threshold voltage level 460), which may occur shortly after time 410 at the beginning of ringing time 430. The primary controller may be configured to stop the time at the end of ZVS time 432 (e.g., the beginning of pulse 484, i.e., when the voltage drop is less than threshold voltage level 460) or at the beginning of pulse 472 delivered by the primary controller to the primary switch, which may be the beginning of charging time 434. In some examples, the primary controller may include a comparator that is configured to compare the voltage drop to threshold voltage level 464 that is just below the plateau of the previous discharging time. When the voltage drop across the primary switch declines below threshold voltage level 464 at or near time 410, the primary controller may be configured to start the timer. By stopping the timer at time 414, the primary controller may obtain a direct measurement of the combined duration of ringing time 430 and ZVS time 432. The primary controller may be configured to subtract the duration of ZVS time 432, which may be a preset duration for every switching period, from the combined duration of ringing time 430 and ZVS time 432.

At time 412, the secondary controller may be configured to begin transmitting enabling control signals to a secondary switch to turn on the secondary switch during ZVS time 432. During ZVS time 432, the secondary winding of the transformer may build electrical current to allow for ZVS of the primary switch at time 414. At the end of ZVS time 432, the voltage drop across the primary switch may decline below threshold voltage level 460 and then may decline below threshold voltage level 462. At time 414, the secondary controller may be configured to turn off the secondary switch. The energy stored in the transformer winding may recharge the parasitic capacitances of the primary switch, and the voltage drop across the primary switch may decline towards zero.

Pulse 484 may begin when the voltage drop declines below threshold voltage level 460, and pulse 470 may begin when the voltage drop declines below threshold voltage level 462. When a comparator in the primary controller outputs pulse 470, the primary controller may be configured to deliver pulse 472 to the primary switch with the same beginning time as pulse 470. Pulse 472 may have the same duration as charging time 434. At approximately time 414, the primary controller may begin transmitting enabling control signals to a primary switch to turn on the primary switch for charging time 420, and the secondary controller may cease transmitting enabling control signals (e.g., begin transmitting non-enabling control signals) to a secondary switch to turn off the secondary switch.

The primary controller may be configured to determine that the voltage drop across the primary switch has fallen below threshold voltage level 462. The primary controller may be configured to begin delivering enabling control signals to the primary switch at time 414. The primary controller may determine the duration of charging time 434 by measuring the duration of ringing time 430. In some examples, the primary controller may be configured to determine the duration of charging time 434 in order to ensure that the duration of the current switching period is at or near a desired duration. In some examples, the primary controller may be configured to determine the duration of charging time 434 by determining the peak current setting for primary switch, which may be the electrical current at which to shut off the primary switch. The primary controller may be configured to determine the peak current setting based on information received by the primary controller during the previous switching period.

At time 416, the primary controller may turn off the primary switch, and the energy stored in the secondary winding of the transformer may begin to flow to the output filter capacitor and the output nodes. The secondary controller may be configured to deliver enabling control signals to the secondary switch during discharging time 436. The secondary controller may be configured to end discharging time 436 at time 418 in order to ensure that the duration of the current switching period is at or near a desired duration. At time 418, all of the energy may have transferred from the transformer to the output nodes of the power electronics system, and the next switching period may begin with ringing period 438. Ringing time 438 may last until time 420 and include only one valley in the voltage drop, unlike ringing time 430, which included two valleys.

In some examples, the primary controller may be configured to measure ringing time 430 and/or 438 by at least counting the integer number of each ringing periods (e.g., valleys and peaks). Counting of the number of number of ringing periods may allow for ZVS time 432 of the secondary switch, so that performance of the power electronics system may improve. In some examples, the primary controller may be configured to configured to determine the duration of ringing time 430 and/or 438 by multiplying the number of ringing periods by the duration of a ringing period. The primary controller may be configured to determine the duration of a ringing period by, for example, starting a timer at the beginning of pulse 480 and stopping the timer at the beginning of pulse 482. In some examples, the primary controller may be configured to determine the duration of a ringing period by starting a timer at the end of pulse 480 and stopping the timer at the end of pulse 482.

The primary controller may be configured to determine the duration of the next charging time based on Equation (1), where T is the duration of a switching period, $t_{ring}$ is the duration of ringing time 430 plus the duration of ZVS time 432, $t_{on1}$ is the duration of charging time 434, tong is the duration of the next charging time, and ti is the duration of charging time 434 plus the duration of discharging time 436.

$$t_{on2} = \frac{(T - t_{ring}) \times t_{on1}}{t_1} \quad (1)$$

In some examples, the primary controller could implement minimal charging times (e.g., minimal peak current settings). Minimal charging times may make it difficult to support fixed frequency operating mode, such that the power electronics system may implement pulse frequency modulation (PFM) mode of operation. The power electronics system may implement the PFM mode in a burst-like pattern such that one or more switching periods are skipped but the resting periods occur at the usual switching frequency. This pattern may keep the quiet zone in the same frequency domain, allowing for reliable operation of the electrical load, which may include a capacitive touch-screen.

Figure 5:
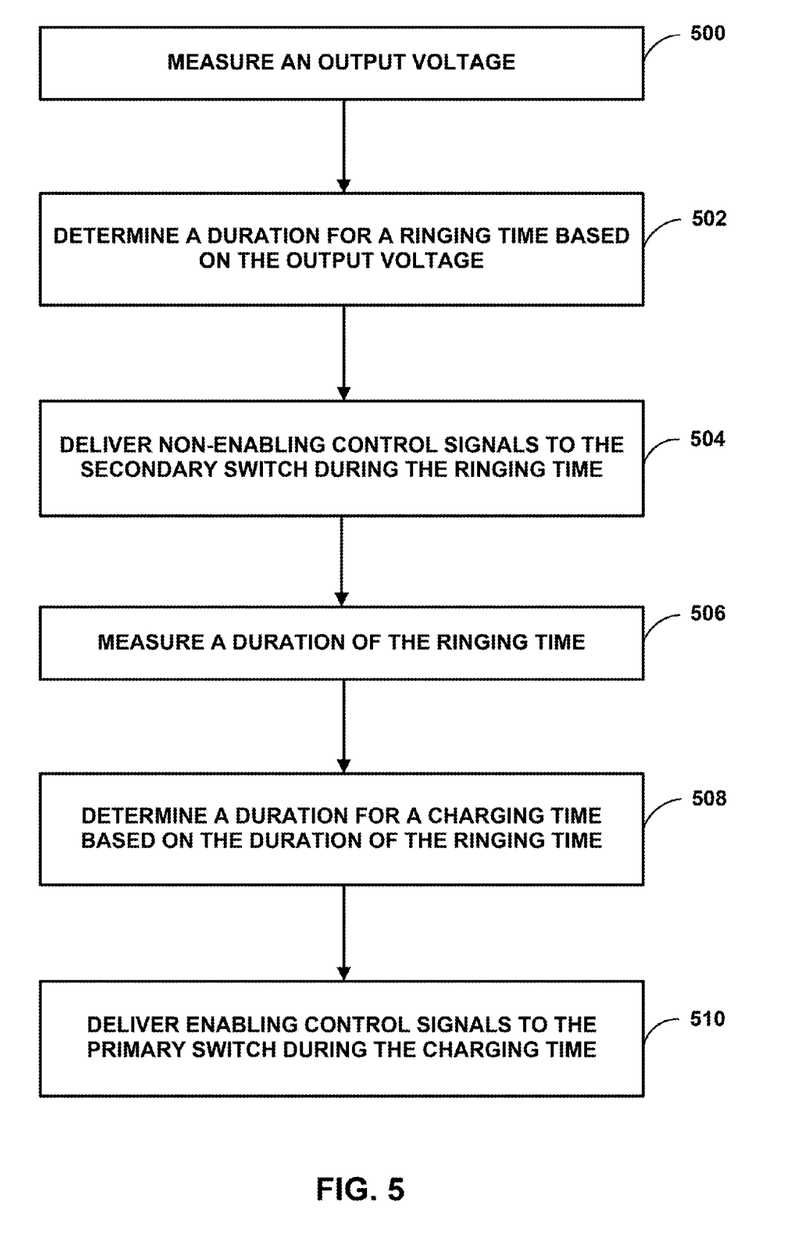
FIG. 5 is a flowchart illustrating example techniques for determining the durations of a ringing time and a charging time, in accordance with some examples of this disclosure.
Figure 6:
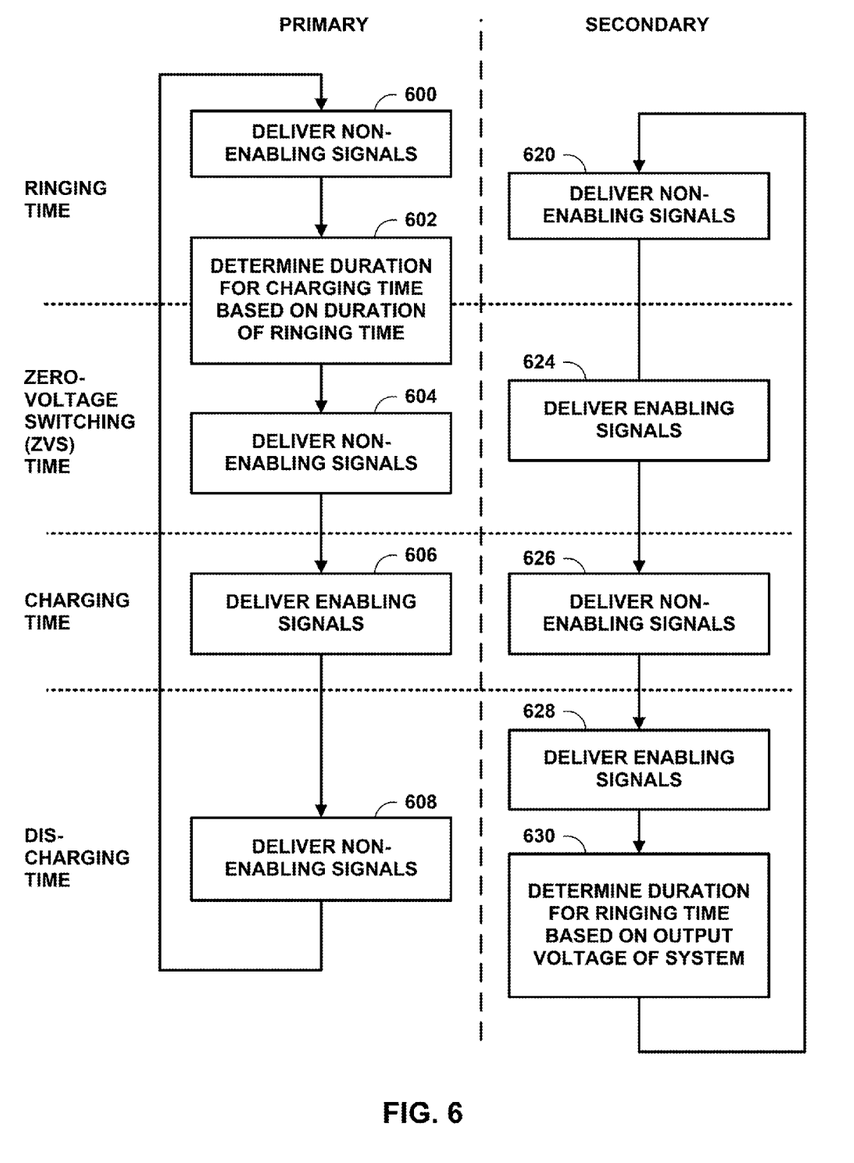
FIG. 6 is a flowchart illustrating example techniques for a primary controller and a secondary controller of a power electronics system, in accordance with some examples of this disclosure.

FIG. 5 is a flowchart illustrating example techniques for determining the durations of a ringing time and a charging time, in accordance with some examples of this disclosure. The example techniques of FIGS. 5 and 6 are described with reference to device 100 in FIG. 1, although other components may exemplify similar techniques. The example of FIGS. 5 and 6 refer to "control signals" (i.e., plural), but each time interval may include each controller a sustained control signal (i.e., singular) for each switch. For example, primary controller 110 may be configured to deliver enabling control signals to primary switch 120 during a charging time by maintaining an enabling voltage level at a control terminal of primary switch 120 during the charging time.

In the example of FIG. 5, secondary controller 112 measures an output voltage (500). The output voltage of power electronics system 100 may be measured across output nodes 172 and 174. Secondary controller 112 may be configured to measure the output voltage by measuring a divided voltage level generated by divider elements 160 and 162.

In the example of FIG. 5, secondary controller 112 determines a duration for a ringing time based on the output voltage (502). In some examples, secondary controller 112 may be configured to determine a shorter duration for the ringing time if the output voltage is less than a desired level and a longer duration if the output voltage is greater than a desired level.

In the example of FIG. 5, secondary controller 112 delivers non-enabling control signals to secondary switch 122 during the ringing time (504). Both of switches 120 and 122 may be turned off during the ringing time, causing the electrical current through windings 132 and 134 to oscillate or ring. At the end of the ringing time, secondary controller 112 may be configured to begin delivering enabling control signals to secondary switch 122 to initiate a ZVS time.

In the example of FIG. 5, primary controller 110 measures a duration of the ringing time (506). In some examples, primary controller 110 may be configured to measure the duration of the ringing time by starting a timer 114 when the voltage drop across primary switch 120 declines below a threshold voltage level and stopping the timer 114 when the voltage drop increases above the threshold voltage level. In some examples, primary controller 110 may be configured to measure the duration of the ringing time by counting the number of valleys and/or peaks (e.g., ringing periods) during the ringing time.

In the example of FIG. 5, primary controller 110 determines a duration for a charging time based on the duration of the ringing time (508). Primary controller 110 may be configured to determine a duration of the charging time that is inversely proportional to the duration of the ringing time, such that longer ringing time causes primary controller 110 to determine a shorter charging time, and vice versa. In this way, primary controller 110 may be configured to detect the signals flowing through secondary winding 134, and primary controller 110 may be configured to follow secondary controller 112, which may determine the duration of the ringing time. In some examples, primary controller 110 may be configured to determine the duration of the charging time by setting a peak current.

In the example of FIG. 5, primary controller 110 delivers enabling control signals to primary switch 120 during the charging time (510). Primary controller 110 may be configured to initiate the charging time at the end of ZVS time when the voltage drop across primary switch 120 declines below a threshold voltage level. In some examples, primary controller 110 may be configured to set a timer 114 at the beginning of the charging time and cease delivering enabling control signals when the timer 114 expires. In some examples, primary controller 110 may be configured to cease delivering enabling control signals when the electrical current through primary switch 120 exceeds the peak current.

FIG. 6 is a flowchart illustrating example techniques for a primary controller and a secondary controller of a power electronics system, in accordance with some examples of this disclosure. In the example of FIG. 6, primary controller 110 and secondary controller 112 deliver non-enabling control signals to switches 120 and 122 during the ringing time (600 and 620). Thus, both of switches 120 and 122 may be turned off during the ringing time. In the example of FIG. 6, primary controller 110 may determine a duration for an upcoming charging time based on the duration of the ringing time (602). Primary controller 110 may be configured to measure the duration of the ringing time by at least starting and stopping a timer 114 based on the output of a comparator.

In the example of FIG. 6, primary controller 110 delivers non-enabling control signals to primary switch 120 and secondary controller 112 delivers enabling control signals to secondary switch 122 during the ZVS time (604 and 624). Thus, primary switch 120 may be turned off during the ZVS time, and secondary switch 122 may be turned on during the ZVS time to cause secondary winding 134 to conduct electrical current to reduce the voltage drop across primary switch 120. In the example of FIG. 6, primary controller 110 delivers enabling control signals to primary switch 120 and secondary controller 112 delivers non-enabling control signals to secondary switch 122 during the charging time (606 and 626). Thus, primary switch 120 may be turned on during the charging time, and secondary switch 122 may be turned off during the charging time, so that primary winding 132 stores energy by building an electrical current.

In the example of FIG. 6, primary controller 110 delivers non-enabling control signals to primary switch 120 and secondary controller 112 delivers enabling control signals to secondary switch 122 during the discharging time (608 and 628). Thus, primary switch 120 may be turned off during the discharging time, and secondary switch 122 may be turned on during the discharging time, so that secondary winding 134 conducts the electrical power stored in transformer 130 to output node 172. In the example of FIG. 6, secondary controller 112 determines a duration for an upcoming ringing time based on the voltage across output nodes 172 and 174 of power electronics system 100 (630). In some examples, secondary controller 112 may be configured to measure the output voltage based on the voltage at a node between divider elements 160 and 162.

The following numbered examples demonstrate one or more aspects of the disclosure.

Example 1

A method includes measuring, by a secondary controller, an output voltage and determining, by the secondary controller, a duration for a ringing time based on the output voltage. The method further includes delivering, by the secondary controller, a non-enabling control signal to a secondary switch during the ringing time and measuring, by a primary controller, a duration of the ringing time. The method also includes determining, by the primary controller, a duration for a charging time based on the duration of the ringing time and delivering, by the primary controller, an enabling control signal to a primary switch during the charging time.

Example 2

The method of example 1, further including delivering, by the secondary controller, an enabling control signal to the secondary switch during a zero-voltage switching (ZVS) time after the ringing time and before the charging time. Measuring the duration of the ringing time includes measuring, at the primary controller, a combined duration of the ringing time and the ZVS time and subtracting, at the primary controller, a duration of the ZVS time from the combined duration of the ringing time and the ZVS time.

Example 3

The method of examples 1-2 or any combination thereof, wherein measuring the combined duration includes starting, at the primary controller, a timer when a voltage drop across load terminals of the primary switch is less than a threshold voltage level during the ringing time; and stopping, at the primary controller, the timer when the voltage drop is less than a threshold voltage level during the ZVS time.

Example 4

The method of examples 1-3 or any combination thereof, wherein measuring the duration of the ringing time includes counting, at the primary controller, a number of ringing periods during the ringing time.

Example 5

The method of examples 1-4 or any combination thereof, wherein measuring the duration of the ringing time further includes measuring, at the primary controller, a duration of a ringing period during the ringing time and multiplying, at the primary controller, the number of ringing periods by the duration of the ringing period.

Example 6

The method of examples 1-5 or any combination thereof, wherein measuring the duration of a ringing period during the ringing time includes starting, at the primary controller, a timer at a first time when a voltage drop across load terminals of the primary switch is less than a threshold voltage level during the ringing time; and stopping, at the primary controller, the timer at a second time when the voltage drop is less than a threshold voltage level during the ringing time.

Example 7

The method of examples 1-6 or any combination thereof, wherein the output voltage is a first instance of the output voltage, wherein the ringing time is a first ringing time. The method further includes delivering, by the secondary controller, an enabling control signal to the secondary switch during a discharging time after the charging time. The method also includes measuring, by the secondary controller, a second instance of the output voltage and determining, by the secondary controller, a duration for a second ringing time based on the second instance of the output voltage. The method includes delivering, by the secondary controller, a non-enabling control signal to the secondary switch during the second ringing time.

Example 8

The method of examples 1-7 or any combination thereof, further including determining, by the secondary controller, a duration for a discharging time such that a duration of a switching cycle is constant; and delivering, by the secondary controller, an enabling control signal to the secondary switch during the discharging time.

Example 9

A system includes primary-side circuitry including a primary switch, a primary winding of a transformer, and a primary controller. The system further includes secondary-side circuitry including a secondary switch, a secondary winding of the transformer magnetically coupled to the primary side, and a secondary controller configured to measure an output voltage of the secondary-side circuitry, wherein the output voltage is based on a signal flowing through the primary winding of the transformer during a charging time. The secondary controller is further configured to determine a duration for a ringing time based on the output voltage and deliver a non-enabling control signal to the secondary switch during the ringing time. The primary controller is configured to measure a duration of the ringing time and determine a duration for the charging time based on the duration of the ringing time. The primary controller is also configured to deliver an enabling control signal to the primary switch during the charging time to cause the signal to flow through the primary winding of the transformer during the charging time.

Example 10

The system of example 9, wherein the secondary controller is further configured to deliver an enabling control signal to the secondary switch during a zero-voltage switching (ZVS) time after the ringing time and before the charging time. The primary controller is configured to measure the duration of the ringing time by at least measuring a combined duration of the ringing time and the ZVS time and subtracting a duration of the ZVS time from the combined duration of the ringing time and the ZVS time.

Example 11

The system of examples 9-10 or any combination thereof, wherein the primary controller is configured to measure the combined duration by at least starting a timer when a voltage drop across load terminals of the primary switch is less than a threshold voltage level during the ringing time; and stopping the timer when the voltage drop is less than a threshold voltage level during the ZVS time.

Example 12

The system of examples 9-11 or any combination thereof, wherein the primary controller is configured to measure the duration of the ringing time by at least counting a number of ringing periods during the ringing time.

Example 13

The system of examples 9-12 or any combination thereof, wherein the primary controller is configured to measure the duration of the ringing time by at least measuring a duration of a ringing period during the ringing time and multiplying the number of ringing periods by the duration of the ringing period.

Example 14

The system of examples 9-13 or any combination thereof, wherein the primary controller is configured to measure the duration of a ringing period during the ringing time by at least starting a timer at a first time when a voltage drop across load terminals of the primary switch is less than a threshold voltage level during the ringing time; and stopping the timer at a second time when the voltage drop is less than a threshold voltage level during the ringing time.

Example 15

The system of examples 9-14 or any combination thereof, wherein the output voltage is a first instance of the output voltage, wherein the ringing time is a first ringing time, and wherein the secondary controller is further configured to deliver an enabling control signal to the secondary switch during a discharging time after the charging time. The secondary controller is further configured to measure a second instance of the output voltage and determine a duration for a second ringing time based on the second instance of the output voltage. The secondary controller is further configured to deliver a non-enabling control signal to the secondary switch during the second ringing time.

Example 16

The system of examples 9-15 or any combination thereof, wherein the secondary controller is further configured to determine a duration for a discharging time such that a duration of a switching cycle is constant and deliver an enabling control signal to the secondary switch during the discharging time.

Example 17

In some examples, a primary-side controller is configured to measure a duration of a ringing time by at least detecting a signal flowing through a secondary winding of a transformer that is magnetically coupled to a primary winding of the transformer. The primary-side controller is further configured to determine a duration for a charging time based on the duration of the ringing time and deliver an enabling control signal to a primary switch of the primary-side circuit during the charging time.

Example 18

The primary-side controller of example 17, wherein the primary-side controller is further configured to deliver a non-enabling control signal to the primary switch during a zero-voltage switching (ZVS) time after the ringing time and before the charging time. The primary-side controller is configured to measure the duration of the ringing time by at least measuring a combined duration of the ringing time and the ZVS time and subtracting a duration of the ZVS time from the combined duration of the ringing time and the ZVS time.

Example 19

The primary-side controller of examples 17-18 or any combination thereof, wherein the primary-side controller is configured to measure the combined duration by at least starting a timer when a voltage drop across load terminals of the primary switch is less than a threshold voltage level during the ringing time; and stopping the timer when the voltage drop is less than a threshold voltage level during the ZVS time.

Example 20

The primary-side controller of examples 17-19 or any combination thereof, wherein the primary-side controller is configured to measure the duration of the ringing time by at least counting a number of ringing periods during the ringing time.

Example 21

The primary-side controller of examples 17-20 or any combination thereof, wherein the primary-side controller is configured to measure the duration of the ringing time by at least measuring a duration of a ringing period during the ringing time and multiplying the number of ringing periods by the duration of the ringing period.

Example 22

The primary-side controller of examples 17-21 or any combination thereof, wherein the primary-side controller is configured to measure the duration of a ringing period during the ringing time by at least starting a timer at a first time when a voltage drop across load terminals of the primary switch is less than a threshold voltage level during the ringing time; and stopping the timer at a second time when the voltage drop is less than a threshold voltage level during the ringing time.

In some examples, an electrical connection may be designed to have zero impedance between two or more components. In some examples, even though two components are designed to be electrically connected, there may be a nonzero electrical resistance and/or nonzero electrical impedance between the components. In addition, an electrical connection between two components may include capacitance and/or inductance between the two components. In addition, even though two or more components may be designed to be electrical isolated, there may be a non-infinite electrical resistance and/or non-infinite electrical impedance between the components.

As described herein, a determination that a first value is "less than" a second value may, in some examples, include a determination that the first value is "less than or equal to" the second value, or vice versa. A determination that a first value is "greater than" a second value may, in some examples, include a determination that the first value is "greater than or equal to" the second value, or vice versa.

Various examples of the disclosure have been described. Any combination of the described systems, operations, or functions is contemplated. These and other examples are within the scope of the following claims.

What is claimed is:
1. A method comprising:
   measuring, by a secondary controller, an output voltage;
   determining, by the secondary controller, a duration for a ringing time based on the output voltage;
   delivering, by the secondary controller, a non-enabling control signal to a secondary switch during the ringing time;
   measuring, by a primary controller, a duration of the ringing time;
   determining, by the primary controller, a duration for a charging time based on the duration of the ringing time; and
   delivering, by the primary controller, an enabling control signal to a primary switch during the charging time.
2. The method of claim 1, further comprising:
   delivering, by the secondary controller, an enabling control signal to the secondary switch during a zero-voltage switching (ZVS) time after the ringing time and before the charging time,
   wherein measuring the duration of the ringing time comprises:
      measuring, at the primary controller, a combined duration of the ringing time and the ZVS time; and
      subtracting, at the primary controller, a duration of the ZVS time from the combined duration of the ringing time and the ZVS time.
3. The method of claim 2, wherein measuring the combined duration comprises:
   starting, at the primary controller, a timer when a voltage drop across load terminals of the primary switch is less than a threshold voltage level during the ringing time; and
   stopping, at the primary controller, the timer when the voltage drop is less than a threshold voltage level during the ZVS time.

4. The method of claim 1, wherein measuring the duration of the ringing time comprises counting, at the primary controller, a number of ringing periods during the ringing time.

5. The method of claim 4, wherein measuring the duration of the ringing time further comprises:
measuring, at the primary controller, a duration of a ringing period during the ringing time; and
multiplying, at the primary controller, the number of ringing periods by the duration of the ringing period.

6. The method of claim 5, wherein measuring the duration of a ringing period during the ringing time comprises:
starting, at the primary controller, a timer at a first time when a voltage drop across load terminals of the primary switch is less than a threshold voltage level during the ringing time; and
stopping, at the primary controller, the timer at a second time when the voltage drop is less than a threshold voltage level during the ringing time.

7. The method of claim 1,
wherein measuring the output voltage comprises measuring a first instance of the output voltage;
wherein determining the duration for the ringing time comprises determining a duration for a first ringing time based on the first instance of the output voltage;
wherein delivering a non-enabling control signal during the ringing time comprises delivering the non-enabling control signal to the secondary switch during the first ringing time;
wherein measuring the duration of the ringing time comprises measuring a duration of the first ringing time;
wherein determining the duration for the charging time is based on the duration of the first ringing time; and
wherein the method further comprises:
delivering, by the secondary controller, an enabling control signal to the secondary switch during a discharging time after the charging time;
measuring, by the secondary controller, a second instance of the output voltage;
determining, by the secondary controller, a duration for a second ringing time based on the second instance of the output voltage; and
delivering, by the secondary controller, a non-enabling control signal to the secondary switch during the second ringing time.

8. The method of claim 1, further comprising:
determining, by the secondary controller, a duration for a discharging time such that a duration of a switching cycle is constant; and
delivering, by the secondary controller, an enabling control signal to the secondary switch during the discharging time.

9. A system comprising:
primary-side circuitry including a primary switch, a primary winding of a transformer, and a primary controller; and
secondary-side circuitry including a secondary switch, a secondary winding of the transformer magnetically coupled to the primary side, and a secondary controller configured to:
measure an output voltage of the secondary-side circuitry, wherein the output voltage is based on a signal flowing through the primary winding of the transformer during a charging time;
determine a duration for a ringing time based on the output voltage; and
deliver a non-enabling control signal to the secondary switch during the ringing time,
wherein the primary controller is configured to:
measure a duration of the ringing time;
determine a duration for the charging time based on the duration of the ringing time; and
deliver an enabling control signal to the primary switch during the charging time to cause the signal to flow through the primary winding of the transformer during the charging time.

10. The system of claim 9,
wherein the secondary controller is further configured to deliver an enabling control signal to the secondary switch during a zero-voltage switching (ZVS) time after the ringing time and before the charging time,
wherein the primary controller is configured to measure the duration of the ringing time by at least:
measuring a combined duration of the ringing time and the ZVS time; and
subtracting a duration of the ZVS time from the combined duration of the ringing time and the ZVS time.

11. The system of claim 10, wherein the primary controller is configured to measure the combined duration by at least:
starting a timer when a voltage drop across load terminals of the primary switch is less than a threshold voltage level during the ringing time; and
stopping the timer when the voltage drop is less than a threshold voltage level during the ZVS time.

12. The system of claim 10, wherein the output voltage is a first instance of the output voltage, wherein the ringing time is a first ringing time, and wherein the secondary controller is further configured to:
deliver an enabling control signal to the secondary switch during a discharging time after the charging time;
measure a second instance of the output voltage;
determine a duration for a second ringing time based on the second instance of the output voltage; and
deliver a non-enabling control signal to the secondary switch during the second ringing time.

13. The system of claim 9, wherein the primary controller is configured to measure the duration of the ringing time by at least counting a number of ringing periods during the ringing time.

14. The system of claim 13, wherein the primary controller is configured to measure the duration of the ringing time by at least:
measuring a duration of a ringing period during the ringing time; and
multiplying the number of ringing periods by the duration of the ringing period.

15. The system of claim 14, wherein the primary controller is configured to measure the duration of a ringing period during the ringing time by at least:
starting a timer at a first time when a voltage drop across load terminals of the primary switch is less than a threshold voltage level during the ringing time; and
stopping the timer at a second time when the voltage drop is less than a threshold voltage level during the ringing time.

16. The system of claim 9, wherein the secondary controller is further configured to:
determine a duration for a discharging time such that a duration of a switching cycle is constant; and
deliver an enabling control signal to the secondary switch during the discharging time.

17. A primary-side controller configured to:
measure a duration of a ringing time by at least detecting a signal flowing through a secondary winding of a transformer that is magnetically coupled to a primary winding of the transformer;
determine a duration for a charging time based on the duration of the ringing time; and
deliver an enabling control signal to a primary switch of the primary-side circuit during the charging time.

18. The primary-side controller of claim 17,
wherein the primary-side controller is further configured to deliver a non-enabling control signal to the primary switch during a zero-voltage switching (ZVS) time after the ringing time and before the charging time,
wherein the primary-side controller is configured to measure the duration of the ringing time by at least:
measuring a combined duration of the ringing time and the ZVS time; and
subtracting a duration of the ZVS time from the combined duration of the ringing time and the ZVS time.

19. The primary-side controller of claim 18, wherein the primary-side controller is configured to measure the combined duration by at least:
starting a timer when a voltage drop across load terminals of the primary switch is less than a threshold voltage level during the ringing time; and
stopping the timer when the voltage drop is less than a threshold voltage level during the ZVS time.

20. The primary-side controller of claim 17, wherein the primary-side controller is configured to measure the duration of the ringing time by at least counting a number of ringing periods during the ringing time.

\* \* \* \* \*